(12) United States Patent
Nakamura

(10) Patent No.: US 8,274,837 B2
(45) Date of Patent: Sep. 25, 2012

(54) NAND FLASH MEMORY

(75) Inventor: Dai Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 272 days.

(21) Appl. No.: 12/727,426

(22) Filed: Mar. 19, 2010

(65) Prior Publication Data

US 2010/0277977 A1 Nov. 4, 2010

(30) Foreign Application Priority Data

Apr. 30, 2009 (JP) ................................. 2009-111287

(51) Int. Cl.
 *G11C 16/04* (2006.01)
 *G11C 16/06* (2006.01)

(52) U.S. Cl. ......... 365/185.25; 365/185.17; 365/185.27; 365/185.33

(58) Field of Classification Search ............. 365/185.09, 365/185.25

See application file for complete search history.

(56) References Cited

U.S. PATENT DOCUMENTS

| | | | |
|---|---|---|---|
| 6,452,437 B1 * | 9/2002 | Takeuchi et al. | 327/513 |
| 6,967,874 B2 * | 11/2005 | Hosono | 365/185.33 |
| 7,382,651 B2 * | 6/2008 | Nagao et al. | 365/185.11 |
| 7,738,299 B2 * | 6/2010 | Kuriyama et al. | 365/185.18 |
| 7,768,835 B2 * | 8/2010 | Goda | 365/185.22 |
| 8,077,525 B2 * | 12/2011 | Nakamura | 365/185.29 |
| 2008/0173996 A1 * | 7/2008 | Han | 257/679 |

FOREIGN PATENT DOCUMENTS

| | | |
|---|---|---|
| JP | 10-214491 | 8/1998 |
| JP | 2008-4236 | 1/2008 |
| JP | 2009-3979 | 1/2009 |

* cited by examiner

*Primary Examiner* — Son Mai

(74) *Attorney, Agent, or Firm* — Oblon, Spivak, McClelland, Maier & Neustadt, L.L.P.

(57) ABSTRACT

A NAND flash memory includes a semiconductor substrate, a well region in the semiconductor substrate, memory cells connected in series in the well region, a discharge circuit connected to the well region, a word line connected to the memory cells, and a control circuit which controls potentials of the well region and the word line. The control circuit set the well region to a first potential, and set the word line to a second potential lower than the first potential, in an erase operation. The discharge circuit comprises a constant current source with a constant discharge speed independent on a temperature, and discharges the well region after the erase operation.

20 Claims, 15 Drawing Sheets

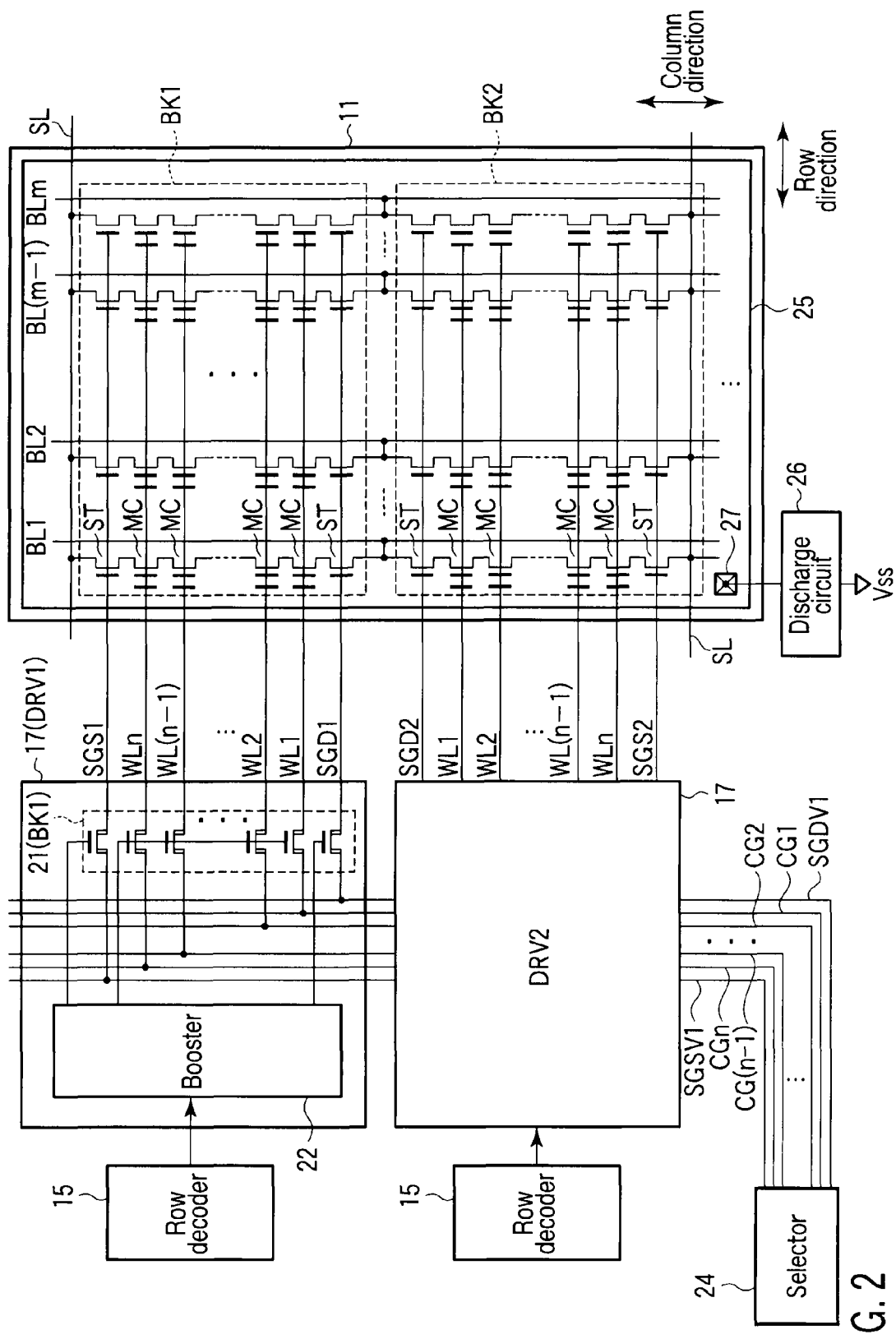
F I G. 2

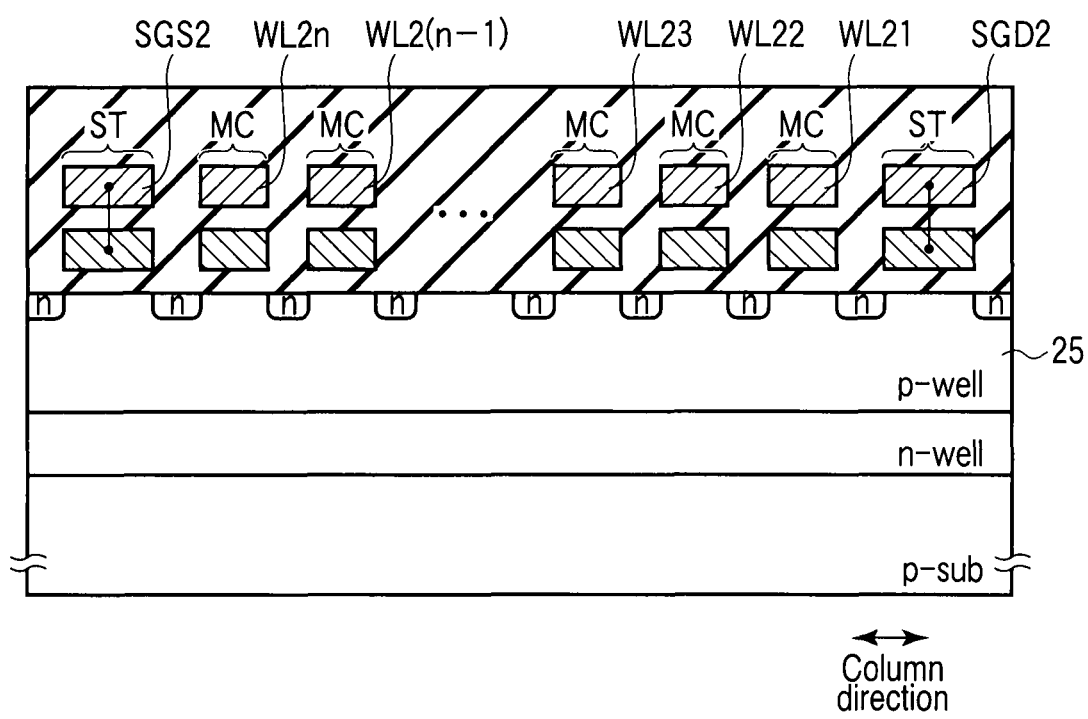
F I G. 4

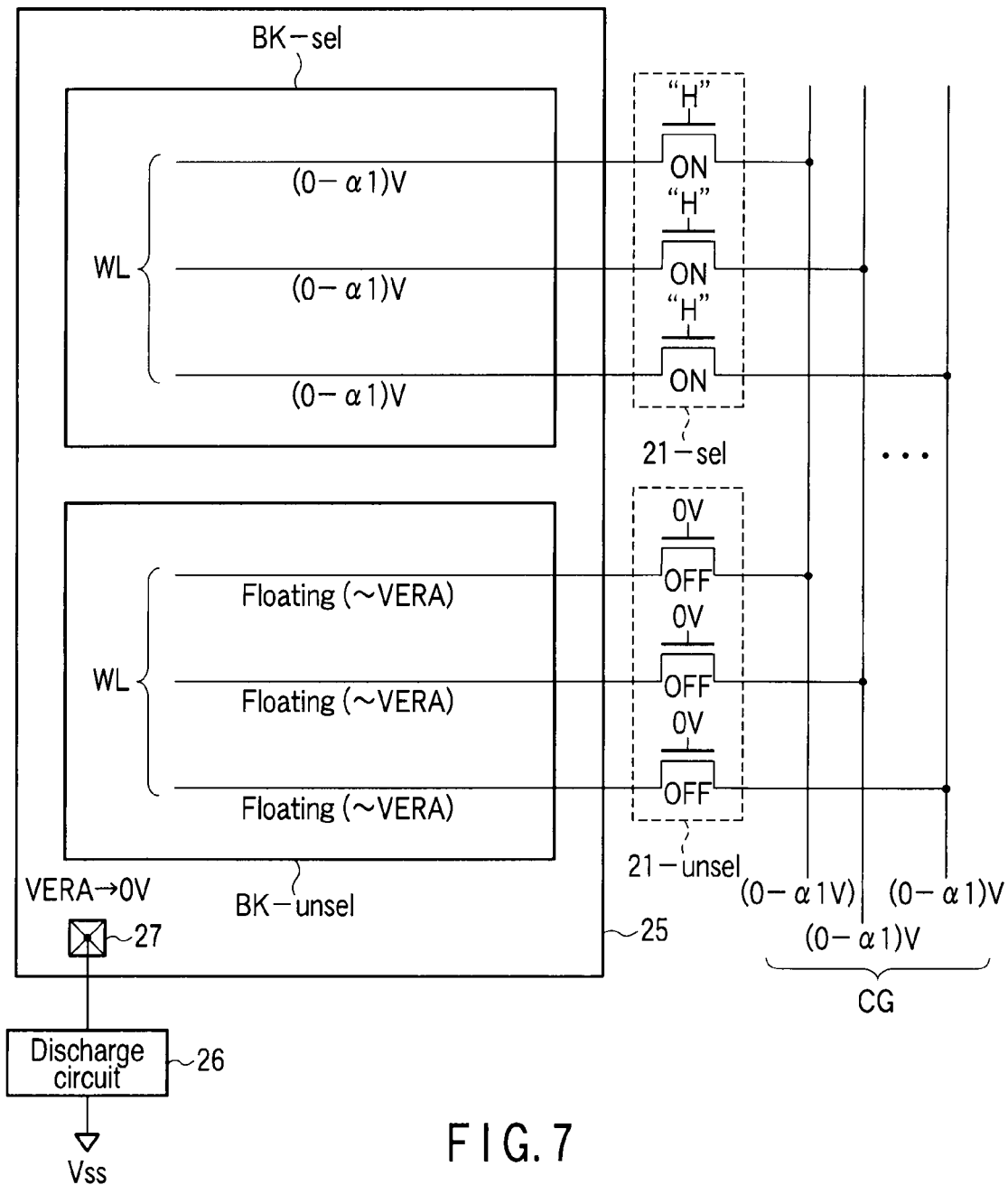
F I G. 7

| State | NAND block | Present invention | Comparative example |
|---|---|---|---|
| Before starting discharge | 21-sel | WL=Vdd, CG=0V, "H" | WL=0V, CG=0V, "H" |
| | 21-unsel | WL=floating (~VERA), CG=0V, 0V | WL=floating (~VERA), CG=0V, 0V |
| During discharge | 21-sel | WL=(0~α1)V, CG=(0~α1)V, "H" | WL=(0~α2)V, CG=(0~α2)V, "H" |
| | 21-unsel | WL=floating (~VERA), CG=(0~α1)V, 0V↗α1<Vth, OFF is kept | WL=floating (~VERA→0V), CG=(0~α2)V, 0V↗α2>Vth, ON |

FIG. 8

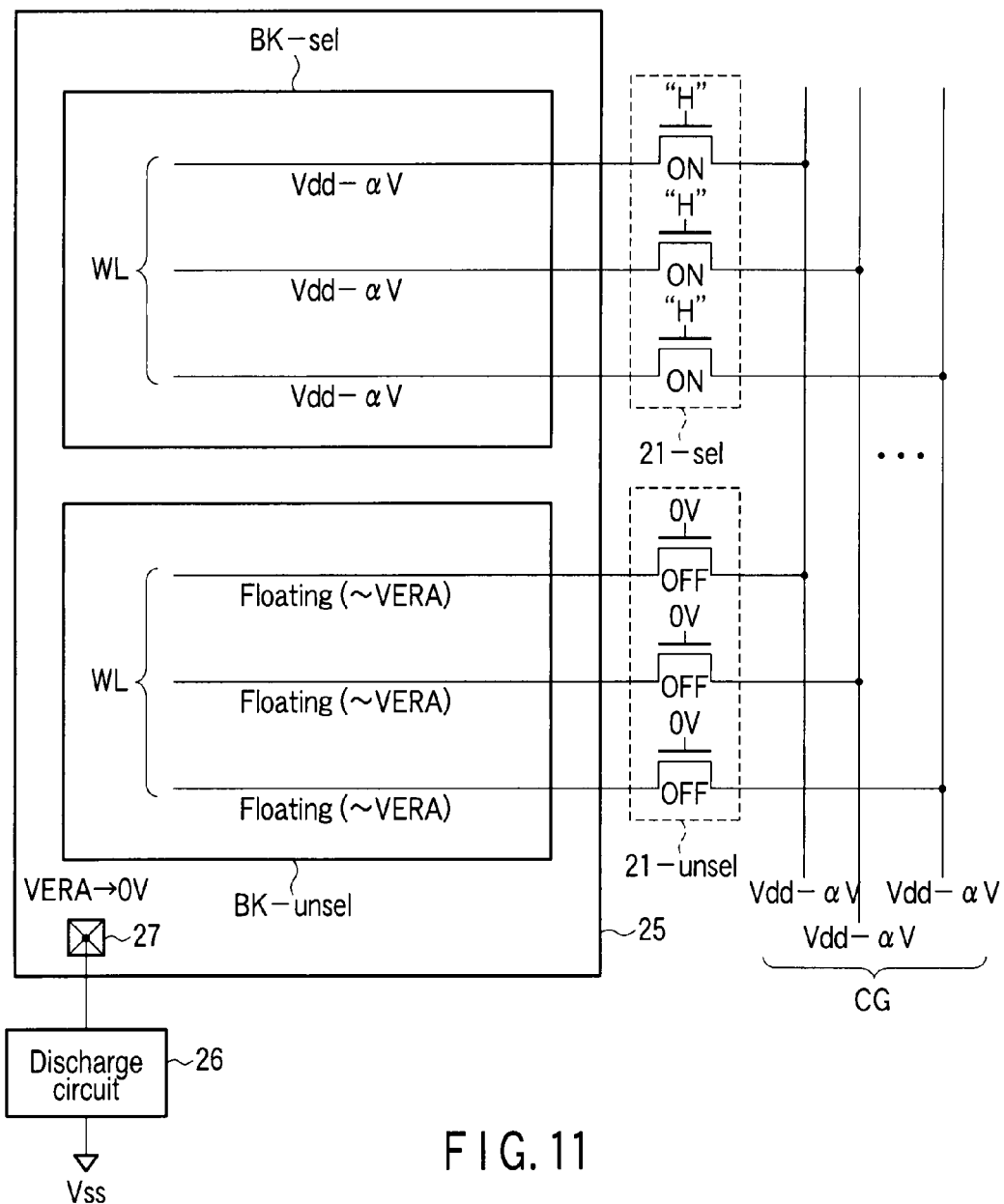
F I G. 11

| State | NAND block | Present invention | Comparative example |
|---|---|---|---|
| Before starting discharge | 21-sel | "H"<br>WL=Vdd  CG=Vdd | "H"<br>WL=0V  CG=0V |
| | 21-unsel | 0V<br>WL=Floating  CG=Vdd*1<br>(~VERA)<br>*Equivalent to state of applying back bias (+Vdd), when CG=0V | 0V<br>WL=Floating  CG=0V<br>(~VERA) |
| During discharge | 21-sel | "H"<br>WL=Vdd−αV  CG=Vdd−αV | "H"<br>WL=(0−α)V  CG=(0−α)V |
| | 21-unsel | 0V  αV−Vdd<Vth<br>WL=Floating  CG=Vdd−αV<br>(~VERA)<br>OFF of kept | 0V  α>Vth<br>WL=Floating  CG=(0−α)V<br>(~VERA→0V)<br>ON |

F I G. 12

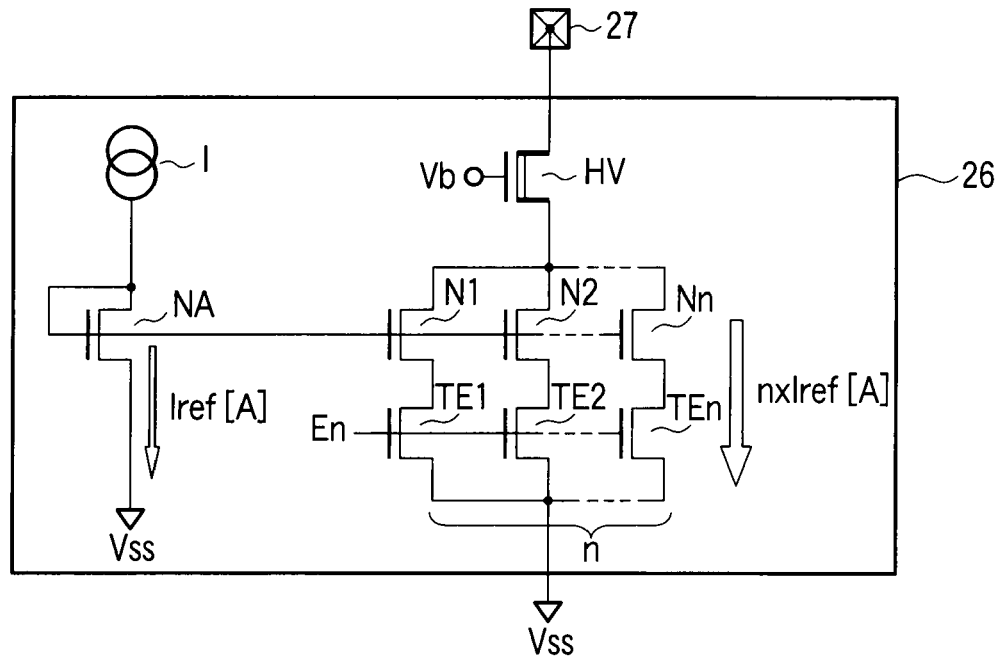
F I G. 13
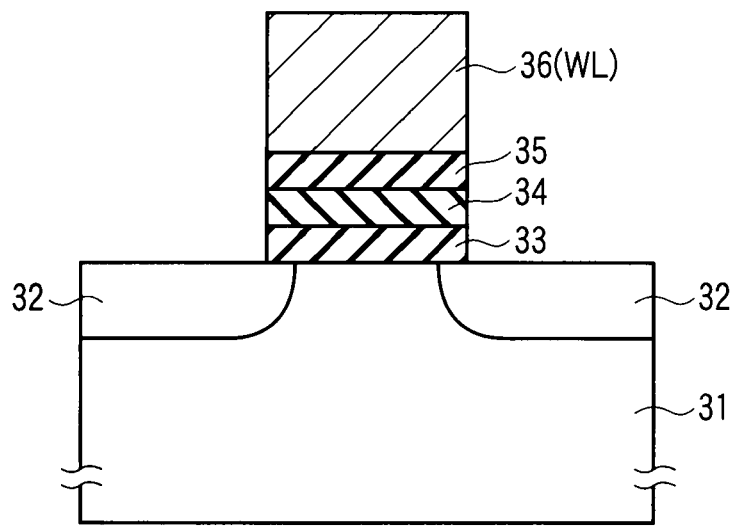
F I G. 14

US 8,274,837 B2

NAND FLASH MEMORY

CROSS-REFERENCE TO RELATED APPLICATIONS

This application is based upon and claims the benefit of priority from prior Japanese Patent Application No. 2009-111287, filed Apr. 30, 2009, the entire contents of which are incorporated herein by reference.

BACKGROUND

1. Field

The present invention relates to an erase operation of a NAND flash memory.

2. Related Art

The memory cell array of a NAND flash memory comprises NAND blocks. The word lines in the NAND blocks are connected via the respective transfer transistor units provided for the corresponding NAND blocks to a control gate line common to all of the NAND blocks.

When data is erased, the control gate line applies not only zero or negative potential to the word lines in the selected NAND block to be erased but also an erase potential of about 20 V to the well, thereby drawing electrons from the floating gates of the memory cells in the selected NAND block into the well.

At this time, the transfer transistors in the transfer transistor units corresponding to the unselected NAND blocks not to be erased are caused to remain off. That is, at the time of erasing, the word lines in the unselected NAND blocks are floating.

Therefore, when an erase potential of about 20 V is applied to the well, the word lines in the unselected NAND blocks are raised to about 20 V by capacitive coupling, which prevents the data from being erased from the memory cells in the unselected NAND blocks.

After the erase operation is completed, the charge accumulated in the well is discharged (e.g., refer to Jpn. Pat. Appln. KOKAI Publication No. H10-214491 and Jpn. Pat. Appln. KOKAI Publication No. 2008-4236).

It is desirable that the period during which the charge in the well is discharged should be shorter. However, it cannot be made just shorter.

The reason is as follows. Although the word lines in the selected NAND block are held at zero potential, if the well discharges too quickly, there is a danger that the word lines in the selected NAND block will drop to a negative potential because of capacitive coupling when the discharge of the well begins.

If such a situation takes place, the control gate line will also drop to a negative potential. This causes the transfer transistors in the transfer transistor units corresponding to the unselected NAND blocks to be changed from off to on, with the result that the potential of the word lines in the unselected NAND blocks drops from about 20 V to zero.

BRIEF SUMMARY

A NAND flash memory according to an aspect of the present invention comprises a semiconductor substrate, a well region in the semiconductor substrate, memory cells connected in series in the well region, a discharge circuit connected to the well region, a word line connected to the memory cells, and a control circuit which controls potentials of the well region and the word line, wherein the control circuit set the well region to a first potential, and set the word line to a second potential lower than the first potential, in an erase operation, wherein the discharge circuit comprises a constant current source with a constant discharge speed independent on a temperature, and discharges the well region after the erase operation.

A NAND flash memory according to an aspect of the present invention comprises a semiconductor substrate, a well region in the semiconductor substrate, memory cells connected in series in the well region, a discharge circuit connected to the well region, a word line connected to the memory cells, and a control circuit which controls potentials of the well region and the word line, wherein the control circuit set the well region to a first potential, and set the word line to a second potential lower than the first potential, in an erase operation, wherein the discharge circuit discharges the well region after the erase operation, wherein the control circuit set the word line to a third potential higher than the second potential before starting a discharge of the well region by using the discharge circuit.

BRIEF DESCRIPTION OF THE DRAWINGS

FIG. 2 is examples of a memory cell array and a word line driver.
FIG. 4 is a cross sectional view in a column direction of a NAND cell unit.
FIG. 7 is a diagram showing a state in a discharging of a first embodiment.
FIG. 8 is a diagram comparing the invention and the comparative example in a bias relationship.
FIG. 11 is a diagram showing a state in discharging of a second embodiment.
FIG. 12 is a diagram comparing the invention and the comparative example in a bias relationship.
FIG. 13 is a diagram showing an example of a discharge circuit.
FIG. 14 is a diagram showing a MONOS type memory cell.

DETAILED DESCRIPTION

A NAND flash memory of the disclosure will be described below in detail with reference to the accompanying drawings.

1. Basic Concept

Firstly, in a NAND flash memory of an aspect of the invention, a discharge circuit, which discharges a well after an erase operation, comprises a constant-current source capable of discharging the well at a constant rate of discharge. The rate of discharge of the well is set such that the potential of the word lines in the selected NAND block does not drop.

Secondly, when or immediately before the discharge of the well begins, a potential higher than the one applied to the word lines in the selected NAND block in an erase operation is applied to the word lines in the selected NAND block.

This enables the transfer transistors in the transfer transistor units corresponding to the unselected NAND blocks to remain off when the well is discharged. Therefore, it is possible not only to prevent the unselected NAND blocks from being erased erroneously but also to increase the rate of discharge of the well.

2. Embodiments

(1) NAND Flash Memory

Figure 1:
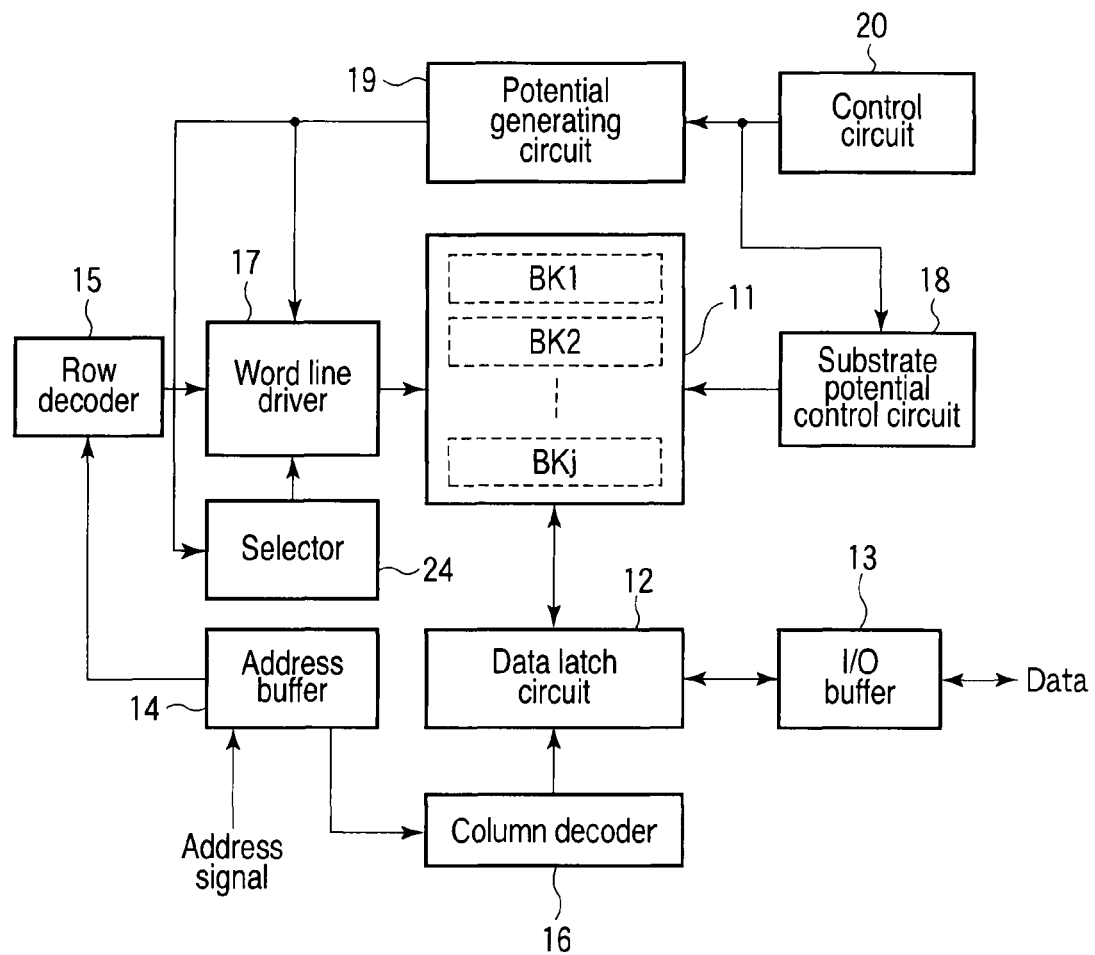
FIG. 1 is an overall view of a NAND flash memory.

FIG. 1 is an overall view of a NAND flash memory.

A memory cell array 11 comprises NAND blocks BK1, BK2, . . . , BLj. Each of NAND blocks BK1, BK2, . . . , BLj includes a NAND cell unit.

A data latch circuit 12, which has the function of temporarily latching data in a read/write operation, comprises, for example, a flip-flop circuit. An input/output (I/O) buffer 13 functions as an interface for data. An address buffer 14 functions as an interface for address signals.

The address signals include a block address signal, a row address signal, and a column address signal.

A row decoder 15 selects one of NAND blocks BK1, BK2, . . . , BLj on the basis of the block address signal. A word line driver 17 drives word lines in the selected NAND block.

A column decoder 16 selects one of bit lines on the basis of the column address signal.

A substrate potential control circuit 18 controls the potential of a semiconductor substrate.

Specifically, when a double well region comprising an n-well region and a p-well region is formed in a p-type semiconductor substrate and memory cells are formed in the p-well region, the potential of the p-well region is controlled according to an operation mode.

For example, the substrate potential control circuit 18 sets the p-well region to zero potential in a read/write operation and to a potential not lower than 15 V nor higher than 40 V (e.g., about 20 V) in an erase operation.

A potential generation circuit 19 generates a potential applied to the word lines.

In the invention, the potential generation circuit 19 generates, for example, zero or negative potential in an erase operation and a potential higher than that generated in an erase operation (e.g., a positive potential) when the well is discharged after the erase operation.

A selector 24 selects the value of a potential applied to the word lines in the selected NAND block on the basis of the operation mode and such information as the position of the selected word line.

A control circuit 20 controls the operations of the substrate potential control circuit 18 and potential generation circuit 19.

FIG. 2 shows a circuit of the memory cell array and word line driver.

The memory cell array 11 includes NAND blocks BK1, BK2, . . . arranged in the column direction.

NAND blocks BK1, BK2, . . . are arranged in a well region (e.g., p-well region) 25. A discharge circuit 26 for discharging the well after an erase operation is connected to the well region 25 via a well contact 27.

Each of NAND blocks BK1, BK2, . . . includes NAND cell units arranged in the row direction. Each of the NAND cell units includes a NAND string comprising memory cells MC connected in series and two select gate transistors ST, each connected to either end of the NAND string.

Figure 3:
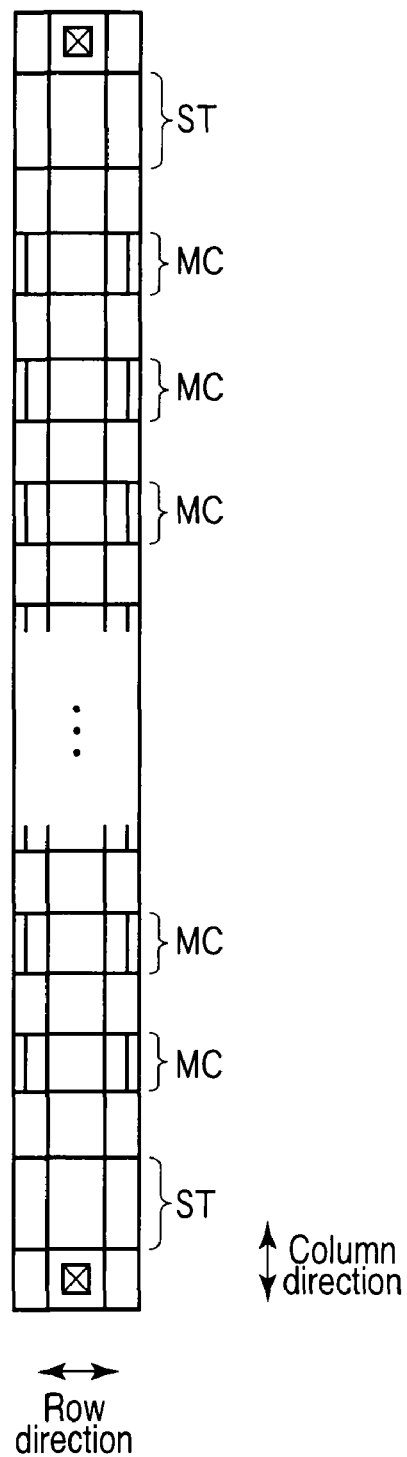
FIG. 3 is a plain view of a NAND cell unit.

The NAND cell unit has, for example, a layout as shown in FIG. 3. A cross section structure in the column direction of the NAND cell unit is, for example, as shown in FIG. 4.

One end of the NAND cell unit is connected to bit lines BL1, BL2, . . . , BLm. The other end of the NAND cell unit is connected to a source line SL.

On the memory cell array 11, word lines WL1, . . . , WLn, . . . and select gate lines SGS1, SGD1, . . . are provided.

For example, in NAND block BK1, an n number (n is two or more) of word lines WL1, . . . , WLn and two select gate lines SGS1, SGD1 are provided. Word lines WL1, . . . , WLn and select gate lines SGS1, SGD1, which extend in the row direction, are connected to signal lines (or control gate lines) CG1, . . . , CGn and signal lines SGSV1, SGDV1, respectively, via a transfer transistor unit 21 (BK1) in the word line driver 17 (DRV1).

Each of signal lines CG1, . . . , CGn and SGSV1, SGDV1 extends in the column direction perpendicular to the row direction and is connected to the selector 24.

The transfer transistor unit 21 (BK1) comprises a high-voltage MISFET so as to be capable of transferring a higher potential than the power supply potential Vcc.

A booster 22 in the word line driver 17 (DRV1) receives a decode signal output from the row decoder 15. The booster 22 turns on the transfer transistor unit 21 (BK1) when NAND block BK1 has been selected and turns off the transfer transistor unit 21 (BK1) when NAND block BK1 has not been selected.

(2) Rate of Discharge of Well Region

As described above, in the NAND flash memory, the word lines in the NAND blocks are connected to the control gate line common to all of the NAND blocks via the respective transfer transistor units provided for the corresponding NAND blocks.

Accordingly, when the discharge of the well region begins after an erase operation, if the word lines in the selected NAND block drop from zero to negative potential because of capacitive coupling, there is a possibility of an erase error occurring in the unselected NAND blocks.

Figure 5:
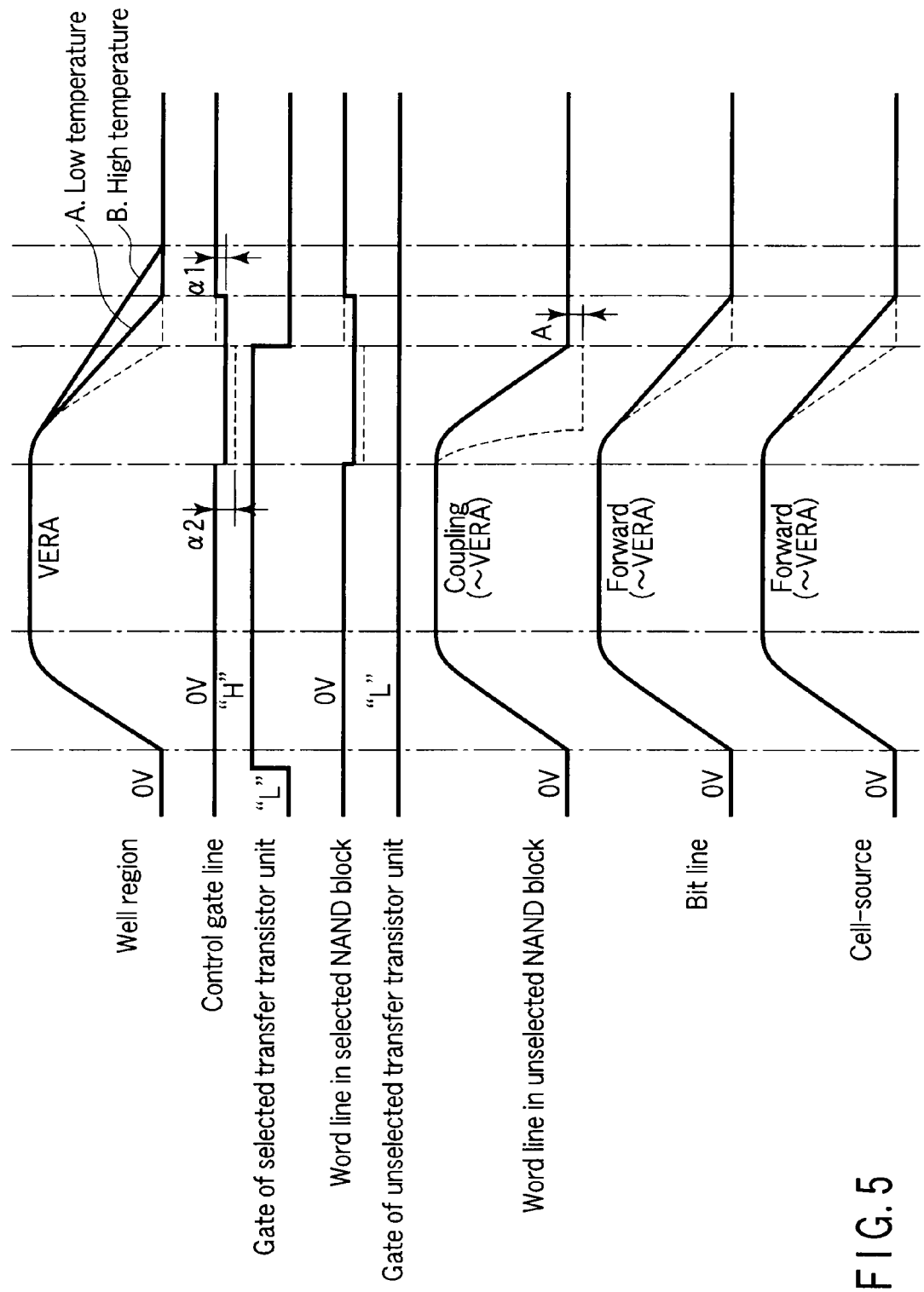
FIG. 5 is a wave form chart which describes a discharge speed of well region.

Specifically, in an erase operation, for example, the gate of the selected transfer transistor unit corresponding to the selected NAND block to be erased is made logically high, thereby applying zero potential to the word lines in the selected NAND block as shown in the waveform diagram of FIG. 5. In addition, an erase potential VERA of about 20 V is applied to the well region.

At this time, since, for example, zero potential is applied as a logical low to the gates of the unselected transfer transistor units corresponding to the unselected NAND blocks not to be erased, the word lines in the unselected NAND blocks are floating.

Therefore, when erase potential VERA is applied to the well region, the word lines in the unselected NAND blocks rise close to erase potential VERA because of capacitive coupling.

Thereafter, the well region is discharged by means of the discharge circuit. At this time, although the word lines in the selected NAND block are held at zero potential, if the well discharges too quickly, when the discharge of the well region begins, the word lines in the selected NAND block drop to a negative potential because of capacitive coupling (as shown by the dotted line in FIG. 5).

Accordingly, the control gate line also drops to a negative potential (as shown by the dotted line in FIG. 5).

At this time, in the transfer transistors in the unselected transfer transistor units corresponding to the unselected NAND blocks, the word lines are floating (~VERA), the control gate line is at a negative potential, and the gates are biased to zero potential.

That is, this state is equivalent to a state where a negative potential is applied as a back gate bias when the control gate line is at zero potential.

Accordingly, if the threshold potential of the transfer transistor is Vth and the potential of the control gate line is $-\alpha 2$, when $\alpha 2>$Vth, the transfer transistor conducts, making an erase error likely in the unselected NAND blocks.

Therefore, when the well region is discharged after data has been erased, the rate of discharge of the well region is set so that such an erase error will not occur.

Specifically, the drive power of the discharge circuit (comprising a depletion-mode FET) which discharges the well region depends on temperature. That is, the threshold potential of the FET becomes lower as the temperature falls, increasing the current, and becomes higher as the temperature rises, decreasing the current.

Accordingly, in a low-temperature state where the FET causes the largest current to flow (at the highest rate of discharge), the rate of discharge of the well region is adjusted so that the aforementioned erase error will not occur, on the basis of the drop in potential ($-\alpha 1$) of the word lines in the selected NAND block (as shown by waveform A in FIG. 5).

In this case, however, the rate of discharge of the well decreases at higher temperatures, increasing the erase time.

(3) First Embodiment

In a first embodiment of the invention, a discharge circuit which discharges a well region comprising a constant-current source capable of discharging the well region at a constant rate of discharge independently of temperature.

Such a constant-current source can be easily realized by means of, for example, a bandgap reference circuit.

The rate of discharge of the well region is adjusted so that an erase error will not occur, for example, a drop in potential of the word lines in the selected NAND block can be suppressed to be no more than $-\alpha 1$ in FIG. 5.

Figure 6:
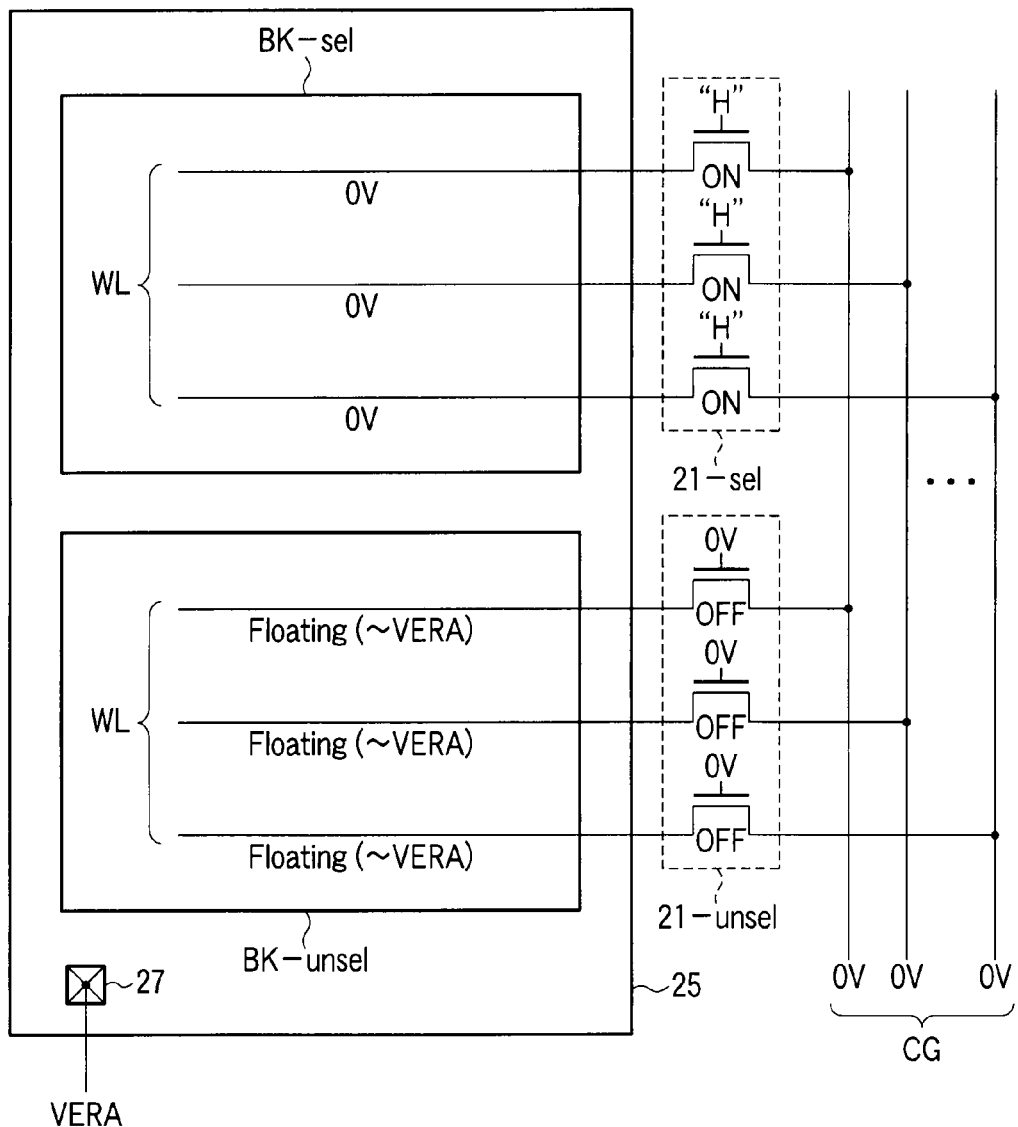
FIG. 6 is a diagram showing a state in an erasing of a first embodiment.

As shown in FIG. 6, in an erase operation, the gates of the selected transfer transistor unit 21-sel corresponding to the selected NAND block BK-sel to be erased are made logically high, thereby applying zero potential to word lines WL in the selected NAND block BL-sel. In addition, an erase potential VERA of about 20 V is applied to the well region 25 via the well contact 27.

At this time, for example, zero potential is applied to the gates of the unselected transfer transistor unit 21-unsel corresponding to the unselected NAND block BK-unsel not to be erased in order to make the gates logically low, with the result that the word lines WL in the unselected NAND block BK-unsel are floating.

Accordingly, when erase potential VERA is applied to the well region 25, the word lines WL in the unselected NAND block BK-unsel rise close to erase potential VERA because of capacitive coupling.

Thereafter, as shown in FIG. 7, the well region 25 is discharged by means of a discharge circuit 26. At this time, when the discharge of the well region 25 begins, the potential of word lines WL in the selected NAND block BK-sel drops to $-\alpha 1$ V because of capacitive coupling.

Accordingly, the potential of control gate line CG also drops to $-\alpha 1$ V.

In the transfer transistor in the unselected transfer transistor unit 21-unsel corresponding to the unselected NAND block BK-unsel, the word lines WL are floating (~VERE), control gate line CG is at a potential of $-\alpha 1$ V, and the gates are biased to zero potential.

If the threshold potential of the transfer transistor is Vth, the relationship $\alpha 1<$Vth is satisfied, which prevents not only the transfer transistor from conducting but also an erase error from occurring in the unselected NAND block BK-unsel.

FIG. 8 shows bias relations of the invention and those of comparative examples. In FIG. 8, $\alpha 2$ corresponds to $\alpha 2$ in FIG. 5 and satisfies the relationship $\alpha 2<\alpha 1$.

As described above, according to the first embodiment, it is possible to cause the transfer transistor in the transfer transistor unit corresponding to the unselected NAND block to remain off when the well region is discharged, which enables not only an erase error in the unselected NAND blocks to be prevented but also the rate of discharge of the well to be increased.

(4) Second Embodiment

In a second embodiment of the invention, when or immediately before the discharge of a well region begins, a potential higher than the one applied to the word lines in the selected NAND block in an erase operation is applied to the word lines in the selected NAND block.

The potential is set to prevent the unselected transfer transistor units corresponding to the unselected blocks from being turned on as a result of a drop in the potential of the word lines in the selected NAND block caused by the discharge of the well region.

It is desirable that the potential should be higher than the drop $\alpha$ in the potential of the word lines in the selected NAND block caused by the discharge of the well region. For example, the potential is preferably power supply potential Vdd.

Figure 9:
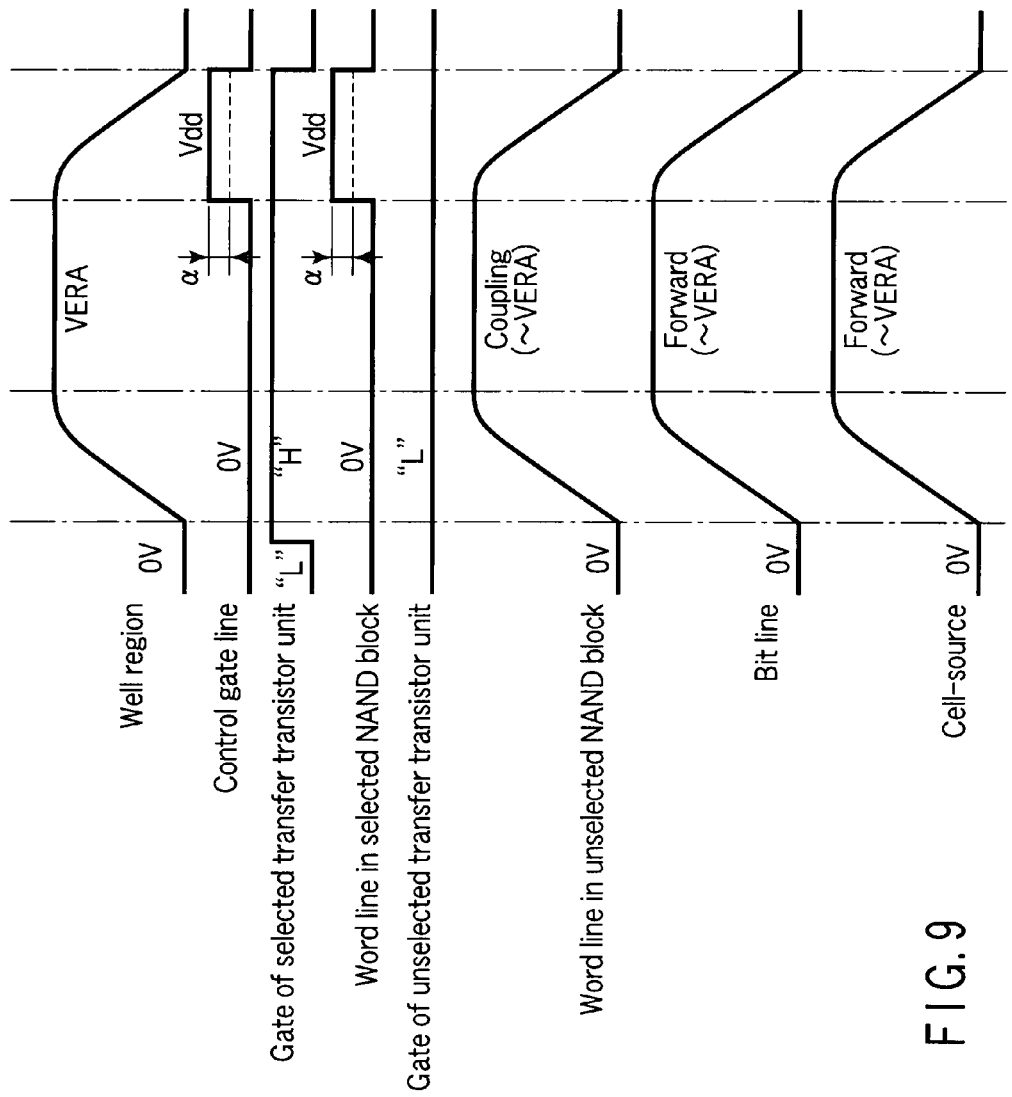
FIG. 9 is a wave form chart in a second embodiment.

FIG. 9 is a waveform diagram of the second embodiment.

Figure 10:
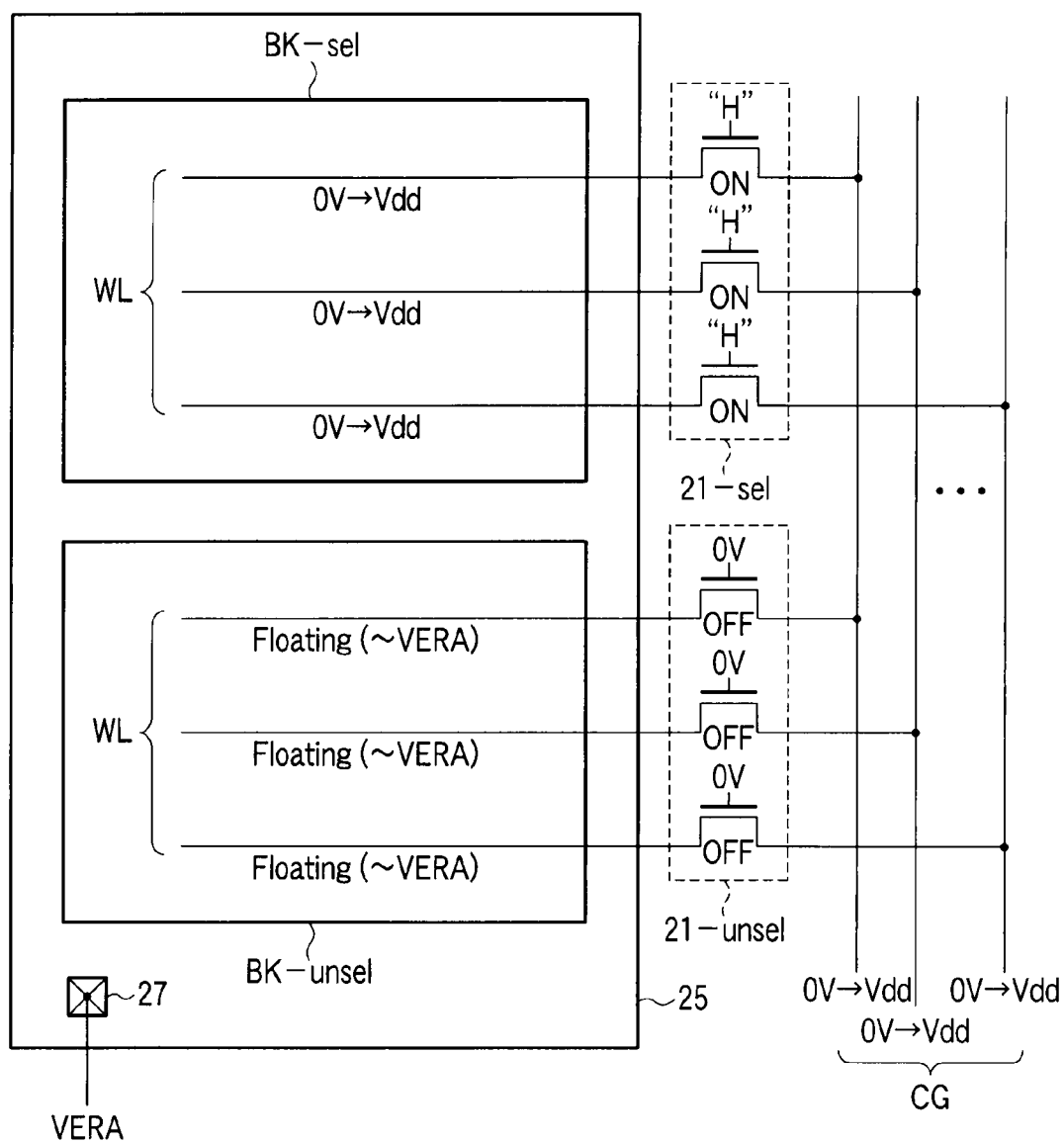
FIG. 10 is a diagram showing a state in a starting of discharge of a second embodiment.

FIG. 10 shows a biased state when the discharge of the well region begins. FIG. 11 shows a biased state when the well region is being discharged.

First, as shown in FIG. 9, in an erase operation, the gates of the selected transfer transistor unit corresponding to the selected NAND block to be erased are made logically high, thereby applying zero potential to the word lines in the selected NAND block. In addition, an erase potential VERA of about 20 V is applied to the well region.

At this time, for example, zero potential is applied to the gates of the unselected transfer transistor unit corresponding to the unselected NAND blocks not to be erased in order to make the gates logically low, with the result that the word lines WL in the unselected NAND blocks are floating.

Accordingly, when erase potential VERA is applied to well region, the word lines WL in the unselected NAND blocks rise close to erase potential VERA because of capacitive coupling.

Next, as shown in FIGS. 9 and 10, when or immediately before the discharge of the well region 25 begins, a potential (e.g., Vdd) higher than the potential (e.g., zero) applied to the word lines in the selected NAND block BK-sel in an erase operation is applied to the word lines WL in the selected NAND block BK-sel via control gate line CG.

Thereafter, as shown in FIGS. 9 and 11, the well region 25 is discharged by means of the discharge circuit 26. At this time, when the discharge of the well region 25 begins, the word lines WL in the selected NAND block BK-sel drop to Vdd$-\alpha$V because of capacitive coupling.

Accordingly, control gate line CG also drops to Vdd−αV.

In the transfer transistor in the unselected transfer transistor unit 21-unsel corresponding to the unselected NAND block BK-unsel, the word lines WL are floating (~VERS), control gate line CG is at Vdd−αV, and the gates are biased to zero potential.

If the threshold potential of the transfer transistor is Vth, the relationship α−Vdd<Vth is satisfied, which prevents not only the transfer transistor from conducting but also an erase error from occurring in the unselected NAND block BK-unsel.

FIG. 12 shows bias relations of the invention and those of comparative examples. In FIG. 12, α corresponds to the potential drop of the word lines in the selected NAND block when the well region is discharged.

As described above, according to the second embodiment, it is possible to cause the transfer transistors in the transfer transistor units corresponding to the unselected NAND blocks to remain off when the well region is discharged, which enables not only an erase error in the unselected NAND blocks to be prevented but also the rate of discharge of the well to be increased.

(5) Example of Discharge Circuit

FIG. 13 shows an example of the discharge circuit.

The discharge circuit 26 includes a constant-current source I. Constant-current source I, which comprises, for example, a bandgap reference circuit, generates a constant current Iref independent of temperature. Constant current Iref flows from constant-current source I to a power supply terminal (e.g., ground terminal) Vss via an n-channel FET NA.

Between the well contact 27 and power supply terminal (e.g., ground terminal) Vss, a high-voltage depletion-mode FET for alleviating stress and n-channel FETs N1, N2, ..., Nn and TE1, TE2, ..., TEn are connected.

When the well region is discharged, an enable signal En goes logically high, thereby making n-channel FETs TE1, TE2, ..., Ten conduct.

Since n-channel FET NA and n-channel FETs N1, N2, ..., Nn constitute a current mirror circuit, the well region can be discharged at n×Iref.

(6) Memory Cell

The memory cells are not limited to a stacked gate structure which includes a floating gate electrode and a control gate electrode. The invention may be applied to memory cells which have a cell structure described below.

FIG. 14 shows a MONOS or a SONOS memory cell.

Suppose a MONOS or a SONOS memory cell is a nonvolatile semiconductor memory cell whose charge storage layer consists of an insulating film.

In a semiconductor substrate (active area) 31, source/drain diffused layers 32 are provided. On a channel region between source/drain diffused layers 32, a gate insulating film (tunnel insulating film) 33, a charge storage layer 34, a block insulating film 35, and a control gate electrode (word line WL) 36 are provided in that order.

Block insulating film 35 is, for example, an oxide/nitride/oxide (ONO) or high-permittivity (high-k) film.

(7) Others

If a memory cell comprises an n-channel FET in a p-well region, when erase potential VERA is applied to the well region in an erase operation, a diode comprising the well region and the diffused layer in the well region is forward-biased, causing the source line (cell source) and bit line to be at erase potential VERA.

In the invention, the discharge of the source line and bit line can be controlled independently of the discharge of the well region. In this case, the rate of discharge of the source line and bit line is determined by taking the rate of discharge of the well region into account.

3. Application Example

The memory cells of a NAND flash memory of the invention may be applied not only to a two-level memory cell which stores two values but also to a multilevel memory cell which stores three or more values. The invention may also be applied to a three-dimensional NAND flash memory, such as bit-cost-scalability (BiCS) NAND.

A system to which the NAND flash memory of the invention is applied will be explained.

Figure 15:
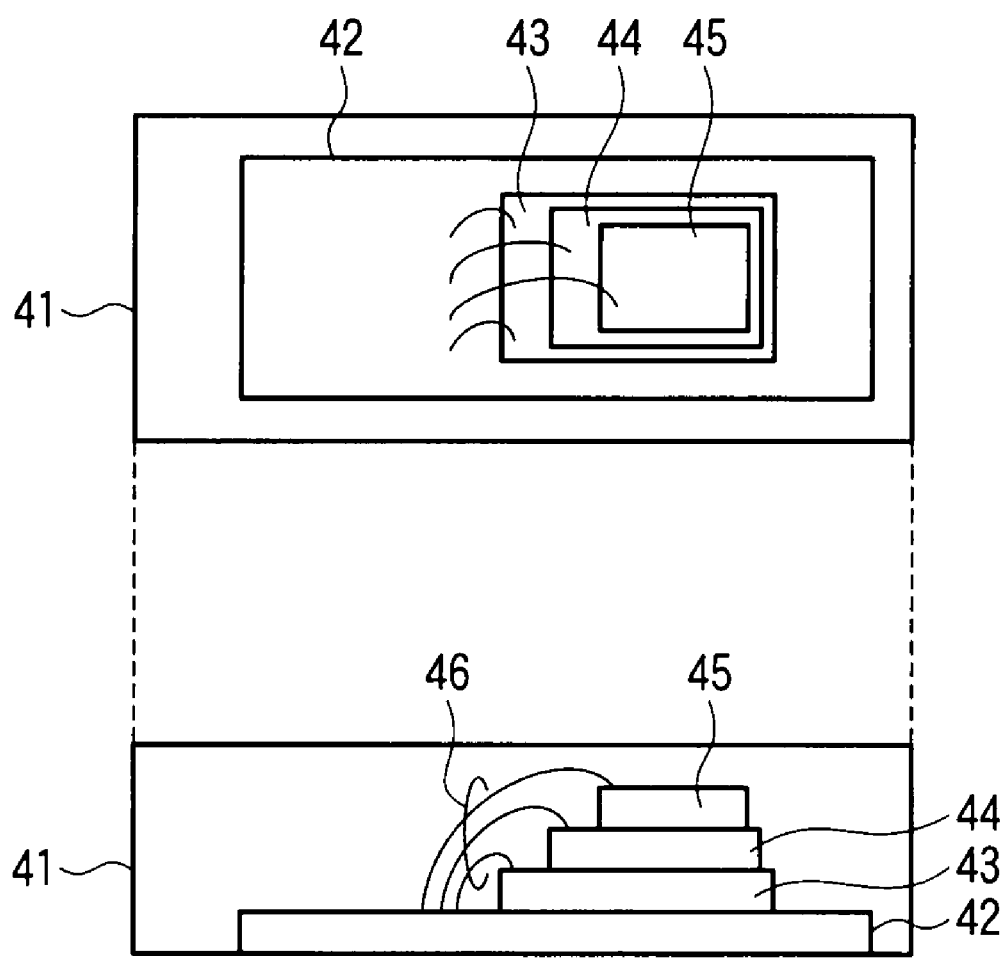
FIG. 15 is a diagram showing an example of a memory system.

FIG. 15 shows a memory system.

The system is, for example, a memory card or a flash drive.

In a package 41, a circuit board 42 and semiconductor chips 43, 44, 45 are arranged. The circuit board 42 is electrically connected to semiconductor chips 43, 44, 55 with bonding wires 46. One of semiconductor chips 43, 44, 45 includes a NAND flash memory of the invention.

In recent years, the technique for electrically connecting the circuit board to semiconductor chips 43, 44, 45 with so-called through-silicon vias passing through the semiconductor substrate instead of bonding wires 46 has been developed. The invention may also be applied to a system to which such through-silicon vias have been applied.

Figure 16:
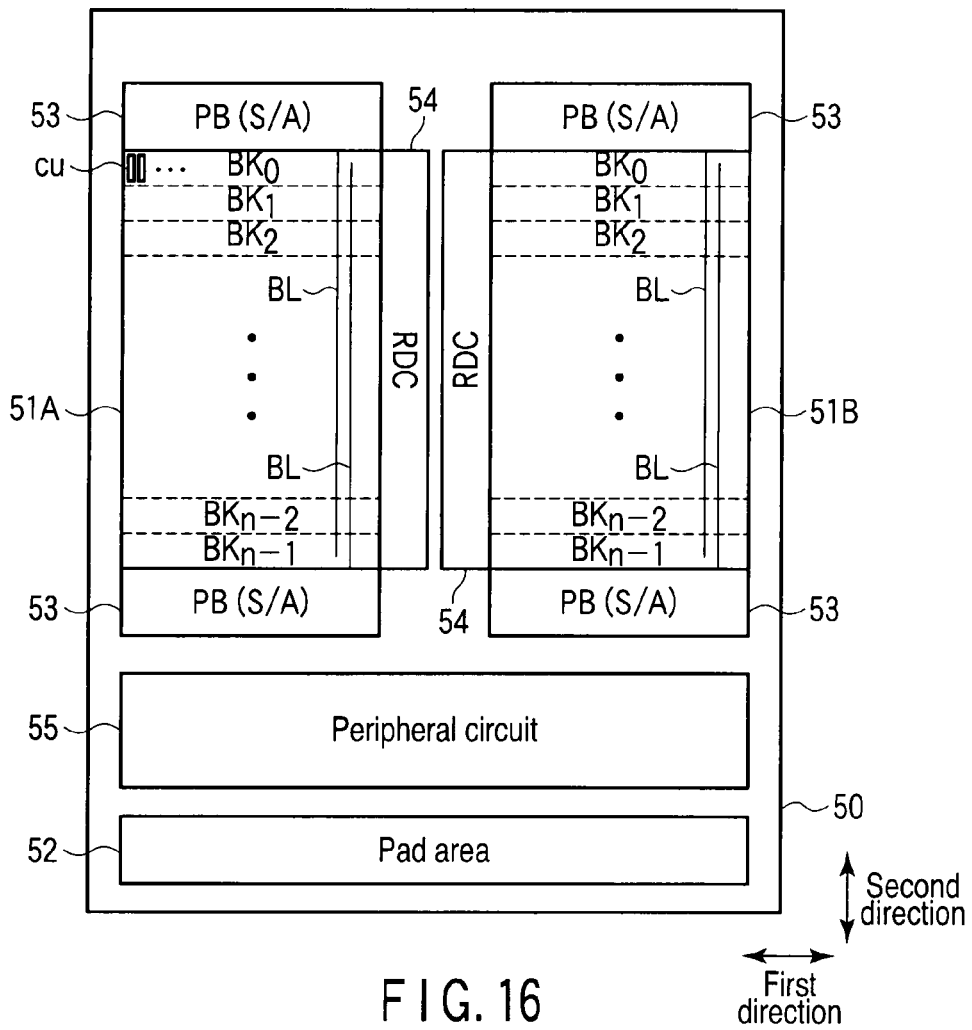
FIG. 16 is a diagram showing an example of a chip layout.

FIG. 16 shows a chip layout.

On a semiconductor chip 50, memory cell arrays 51A, 51B are arranged. Each of memory cell arrays 51A, 51B includes NAND blocks BK0, BK1, ..., BKn−1 arranged in a second direction. Each of NAND blocks BK0, BK1, ..., BKn−1 includes cell units CU arranged in a first direction.

Figure 17:
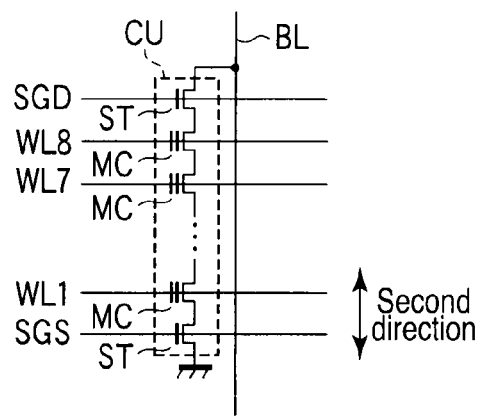
FIG. 17 is a diagram showing a cell unit.

As shown in FIG. 17, a cell unit CU is a NAND string comprising memory cells MC connected in series in the second direction and two select gate transistors ST each connected to either end of the series combination of memory cells MC.

On each of memory cell arrays 51A, 51B, bit lines BL extending in the second direction are provided. On either side in the second direction of each of memory cell arrays 51A, 51B, a page buffer (PB) 53 is provided. The page buffer 53 has the function of temporarily storing read data/write data in a read/write operation. The page buffer 53 also functions as a sense amplifier (S/A) in performing a read operation or verification in a write/erase operation.

At one end in the first direction of each of memory cell arrays 51A, 51B (or at one end opposite to the outer end of semiconductor chip 50), a row decoder (RDC) 54 is provided. On one side in the second direction of memory cell arrays 51A, 51B, a pad area 52 is provided along the periphery of semiconductor chip 50. Between the page buffers 53 and pad area 52, a peripheral circuit 55 is provided.

4. Conclusion

According to the invention, a drop in the potential of the word lines in the selected NAND block can be suppressed when the well is discharged, which makes it possible not only to prevent the unselected NAND blocks from being erased erroneously but also to increase the rate of discharge of the well.

The invention has the industrial merit of providing a technique for achieving higher speed operation of a NAND flash memory and improving reliability.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A NAND flash memory comprising:
a semiconductor substrate;
a well region in the semiconductor substrate;
memory cells connected in series in the well region;
a discharge circuit connected to the well region;
a word line connected to the memory cells; and
a control circuit which controls potentials of the well region and the word line,
wherein the control circuit sets the well region to a first potential, and sets the word line to a second potential lower than the first potential, to execute an erase operation,
wherein the discharge circuit discharges the well region after the erase operation,
wherein the control circuit sets the word line to a third potential higher than the second potential after setting the well region to the first potential and before starting a discharge of the well region by using the discharge circuit.

2. The memory according to claim 1,
wherein the discharge circuit comprises a constant current source with a constant discharge speed independent on a temperature.

3. The memory according to claim 1,
wherein the first potential is a plus potential, and the second potential is a minus potential.

4. The memory according to claim 1,
wherein the well region is discharged independent on a discharge of a source line which is connected to one end of the memory cells and a discharge of a bit line which is connected to the other end of the memory cells.

5. The memory according to claim 1,
wherein each of the memory cells is a floating gate type memory cell having a floating gate electrode as a charge storage layer.

6. The memory according to claim 1,
wherein each of the memory cells is a MONOS type or SONOS type memory cell in which a charge storage layer is made of an insulating film.

7. The memory according to claim 1,
wherein each of the memory cells is a 2-level type memory cell which stores 2 values.

8. The memory according to claim 1,
wherein each of the memory cells is a multi-level type memory cell which stores 3 or more values.

9. The memory according to claim 1,
wherein the memory cells are disposed in an unselected block which is not an erase target.

10. A memory system comprising:
a circuit board;
semiconductor chips stacked upon each other on the circuit board; and
a package which packs the circuit board and the semiconductor chips,
wherein the at least one of the semiconductor chips includes the memory according to claim 1.

11. A NAND flash memory comprising:
a semiconductor substrate;
a well region in the semiconductor substrate;
first and second memory blocks in the well region;
a discharge circuit connected to the well region;
first word lines connected to memory cells in the first memory block;
second word lines connected to memory cells in the second memory block;
control gate lines which are shared by the first and second memory blocks;
first transfer transistors between the first word lines and the control gate lines;
second transfer transistors between the second word lines and the control gate lines; and
a control circuit which is configured to:
execute an erase operation of the memory cells in the first memory block by setting the well region to a first potential, setting the first word lines to a second potential lower than the first potential, and setting the second word lines to a floating state;
discharge the well region by using the discharge circuit after the erase operation; and
keep the floating state of the second word lines by setting the control gate lines and the first word lines to a third potential higher than the second potential after setting the well region to the first potential and before starting a discharge of the well region by using the discharge circuit.

12. The memory according to claim 11,
wherein the discharge circuit comprises a constant current source with a constant discharge speed independent of a temperature.

13. The memory according to claim 11,
wherein the first potential is a plus potential, and the second potential is a minus potential.

14. The memory according to claim 11,
wherein the well region is discharged independently of a discharge of a source line which is connected to one end of the first and second memory cells and a discharge of a bit line which is connected to the other end of the first and second memory cells.

15. The memory according to claim 11,
wherein each of the first and second memory cells is a floating gate type memory cell having a floating gate electrode as a charge storage layer.

16. The memory according to claim 11,
wherein each of the first and second memory cells is a MONOS type or SONOS type memory cell in which a charge storage layer is made of an insulating film.

17. The memory according to claim 11,
wherein each of the first and second memory cells is a 2-level type memory cell which stores 2 values.

18. The memory according to claim 11,
wherein each of the first and second memory cells is a multi-level type memory cell which stores 3 or more values.

19. The memory according to claim 11,
wherein the second memory cells in the second memory block do not execute the erase operation, and the second transfer transistors are kept in an off-state during the erase operation.

20. A memory system comprising:
a circuit board;
semiconductor chips on the circuit board, which are stacked upon each other; and
a package which packs the circuit board and the semiconductor chips,
wherein the at least one of the semiconductor chips includes the memory according to claim 11.

* * * * *